(12) United States Patent
Morikazu et al.

(10) Patent No.: US 10,103,061 B2
(45) Date of Patent: Oct. 16, 2018

(54) PROCESSING METHOD OF SINGLE-CRYSTAL SUBSTRATE

(71) Applicant: DISCO CORPORATION, Tokyo (JP)

(72) Inventors: Hiroshi Morikazu, Tokyo (JP); Noboru Takeda, Tokyo (JP); Takumi Shotokuji, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 21 days.

(21) Appl. No.: 15/057,428

(22) Filed: Mar. 1, 2016

(65) Prior Publication Data

US 2016/0260630 A1 Sep. 8, 2016

(30) Foreign Application Priority Data

Mar. 6, 2015 (JP) .................. 2015-044635

(51) Int. Cl.
H01L 21/78 (2006.01)
H01L 21/67 (2006.01)
(Continued)

(52) U.S. Cl.
CPC ............ *H01L 21/78* (2013.01); *H01L 21/268* (2013.01); *H01L 21/67092* (2013.01);
(Continued)

(58) Field of Classification Search
CPC ................ B23K 2201/40; H01L 21/78; H01L 2221/68327–2221/68336; H01L 21/6836;
(Continued)

(56) References Cited

U.S. PATENT DOCUMENTS 5,486,264 A 1/1996 Ghandour
6,665,050 B2 12/2003 Shiraishi
(Continued)

FOREIGN PATENT DOCUMENTS

JP 10-305420 11/1998
JP 2002-192370 7/2002
(Continued)

OTHER PUBLICATIONS

Berthold A, et al, Proceedings of the SeSens Workshop, (2010) pp. 613-616.
(Continued)

*Primary Examiner* — Marvin Payen
*Assistant Examiner* — Jeremy Joy
(74) *Attorney, Agent, or Firm* — Greer Burns & Crain, Ltd.

(57) ABSTRACT

Disclosed herein is a processing method of a single-crystal substrate having a film formed on a front side or a back side thereof to divide the single-crystal substrate along a plurality of preset division lines. The method includes a film removing step of removing the film along the division lines, a shield tunnel forming step of applying a pulsed laser beam having a wavelength which permeates through the single-crystal substrate along the division lines to form shield tunnels, each including a fine hole and an amorphous region shielding the fine hole, in the single-crystal substrate along the division lines, and dividing step of exerting an external force on the single-crystal substrate to which the shield tunnel forming step is performed to divide the single-crystal substrate along the division lines.

19 Claims, 11 Drawing Sheets

US 10,103,061 B2
Page 2

(51) Int. Cl.
*H01L 21/268* (2006.01)
*H01L 21/683* (2006.01)
*B23K 26/00* (2014.01)
*B23K 26/40* (2014.01)
*H01S 5/02* (2006.01)
*H01S 5/323* (2006.01)

(52) U.S. Cl.
CPC ...... *H01L 21/6836* (2013.01); *B23K 26/0057* (2013.01); *B23K 26/40* (2013.01); *H01L 2221/68327* (2013.01); *H01L 2221/68381* (2013.01); *H01S 5/0201* (2013.01); *H01S 5/0202* (2013.01); *H01S 5/32341* (2013.01)

(58) Field of Classification Search
CPC ............. H01L 21/67092; H01L 21/268; H01L 21/782–21/784; H01L 21/82–21/8249; H01L 21/8252–21/8258
See application file for complete search history.

(56) References Cited

U.S. PATENT DOCUMENTS

| | | | |
|---|---|---|---|
| 6,992,026 B2 | 1/2006 | Fukuyo et al. | |
| 9,130,057 B1* | 9/2015 | Kumar | H01L 21/67092 |
| 9,165,832 B1* | 10/2015 | Papanu | H01L 21/78 |
| 9,209,591 B2 | 12/2015 | Takeda et al. | |
| 9,305,793 B2 | 4/2016 | Morikazu et al. | |
| 9,349,646 B2 | 5/2016 | Morikazu et al. | |
| 2004/0002199 A1 | 1/2004 | Fukuyo | B23K 26/0057 438/460 |
| 2004/0112880 A1* | 6/2004 | Sekiya | B23K 26/032 219/121.69 |
| 2004/0266146 A1 | 12/2004 | Jung | |
| 2005/0106782 A1* | 5/2005 | Genda | B23K 26/18 438/118 |
| 2005/0186760 A1* | 8/2005 | Hashimura | B23K 26/18 438/460 |
| 2005/0199592 A1* | 9/2005 | Iri | B23K 26/0057 219/121.6 |
| 2005/0272223 A1* | 12/2005 | Fujii | B23K 26/0057 438/459 |
| 2005/0272233 A1* | 12/2005 | Lee | H01L 21/823437 438/585 |
| 2006/0105544 A1* | 5/2006 | Takanashi | C09D 5/32 438/460 |
| 2006/0148211 A1* | 7/2006 | Iwasaki | H01L 21/67092 438/462 |
| 2006/0216911 A1* | 9/2006 | Yoshikawa | B23K 26/40 438/460 |
| 2006/0220183 A1* | 10/2006 | Asai | H01L 21/67132 257/622 |
| 2007/0004179 A1 | 1/2007 | Nakamura et al. | |
| 2007/0085099 A1* | 4/2007 | Fukumitsu | B23K 26/0884 257/98 |
| 2007/0111477 A1* | 5/2007 | Maruyama | B23K 26/0057 438/460 |
| 2007/0298529 A1* | 12/2007 | Maeda | B23K 26/0057 438/33 |
| 2008/0050905 A1 | 2/2008 | Uchida et al. | |
| 2008/0233719 A1 | 9/2008 | Omata | |
| 2008/0242055 A1* | 10/2008 | Morikazu | B23K 26/0853 438/463 |
| 2009/0079073 A1* | 3/2009 | Mizusawa | H01L 23/3114 257/738 |
| 2009/0124063 A1* | 5/2009 | Nakamura | B23K 26/009 438/463 |
| 2009/0266802 A1* | 10/2009 | Sawabe | B23K 26/046 219/121.67 |
| 2009/0283127 A1* | 11/2009 | Juso | H01L 31/18 136/244 |
| 2009/0298263 A1* | 12/2009 | Watanabe | B23K 26/0057 438/463 |
| 2010/0136766 A1* | 6/2010 | Sakamoto | B23K 26/0057 438/463 |
| 2011/0001220 A1* | 1/2011 | Sugiura | B23K 26/0057 257/618 |
| 2012/0119386 A1* | 5/2012 | Ito | H01L 21/78 257/777 |
| 2012/0329246 A1* | 12/2012 | Finn | H01L 21/78 438/462 |
| 2013/0126573 A1* | 5/2013 | Hosseini | B23K 26/0057 225/2 |
| 2013/0337633 A1* | 12/2013 | Seddon | H01L 21/78 438/462 |
| 2014/0145294 A1* | 5/2014 | Moeller | H01L 21/78 257/499 |
| 2014/0213040 A1* | 7/2014 | Morikazu | H01L 21/78 438/462 |
| 2014/0248757 A1* | 9/2014 | Morikazu | H01L 21/78 438/463 |
| 2014/0256150 A1* | 9/2014 | Morikazu | H01L 21/30604 438/746 |
| 2014/0334511 A1* | 11/2014 | Takeda | H01S 3/10 372/41 |
| 2015/0044799 A1* | 2/2015 | Takeda | H01L 21/2686 438/33 |
| 2015/0064824 A1* | 3/2015 | Fukaya | H01L 33/0095 438/33 |
| 2015/0166391 A1* | 6/2015 | Marjanovic | C03B 33/0222 428/43 |
| 2016/0268155 A1 | 9/2016 | Morikazu et al. | |

FOREIGN PATENT DOCUMENTS

| | | |
|---|---|---|
| JP | 2003-163323 | 6/2003 |
| JP | 2007-067082 | 3/2007 |
| JP | 2007-330985 | 12/2007 |

OTHER PUBLICATIONS

U.S. Appl. No. 14/188,896, filed Feb. 25, 2014.
U.S. Appl. No. 14/185,189, filed Feb. 20, 2014.
U.S. Appl. No. 14/276,571, filed May 13, 2014.
U.S. Appl. No. 15/068,141, filed Mar. 11, 2016.

* cited by examiner

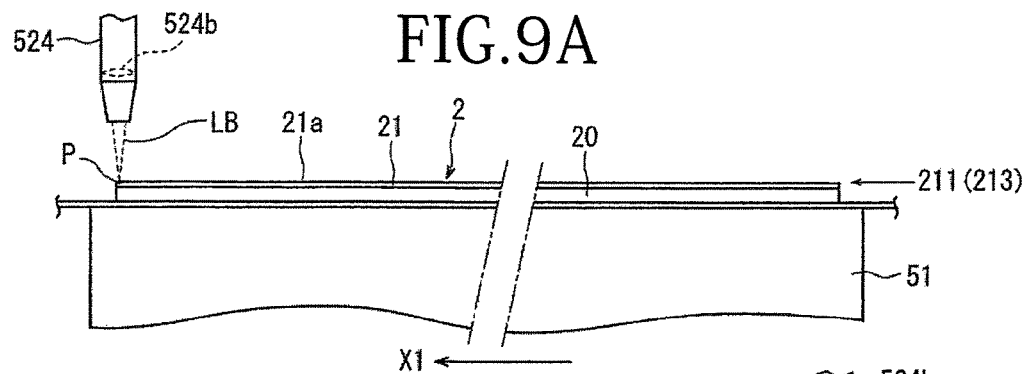
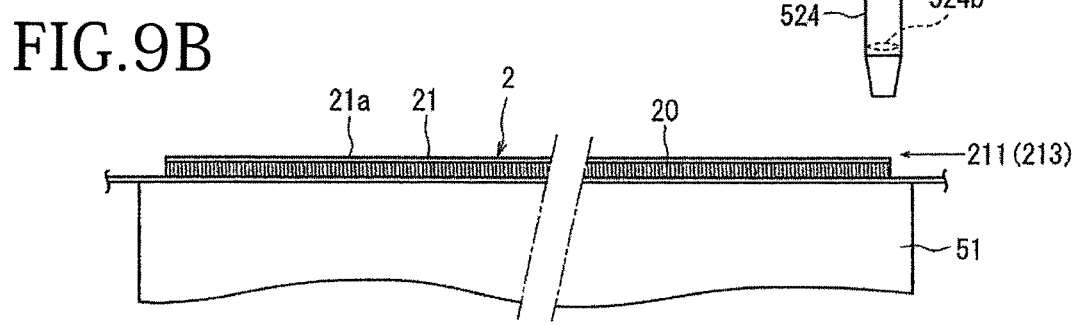
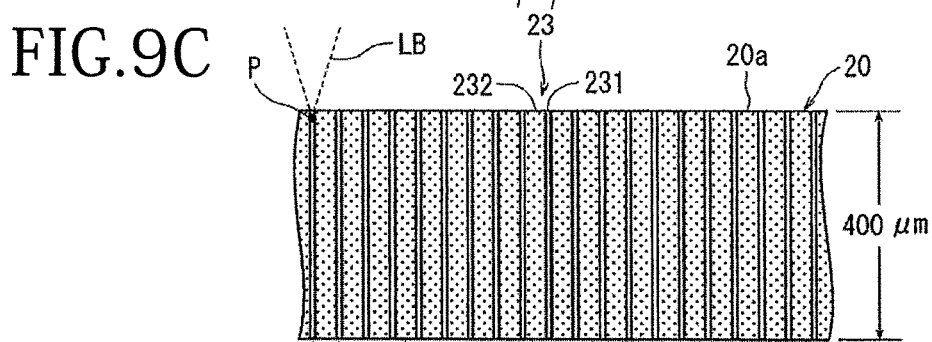
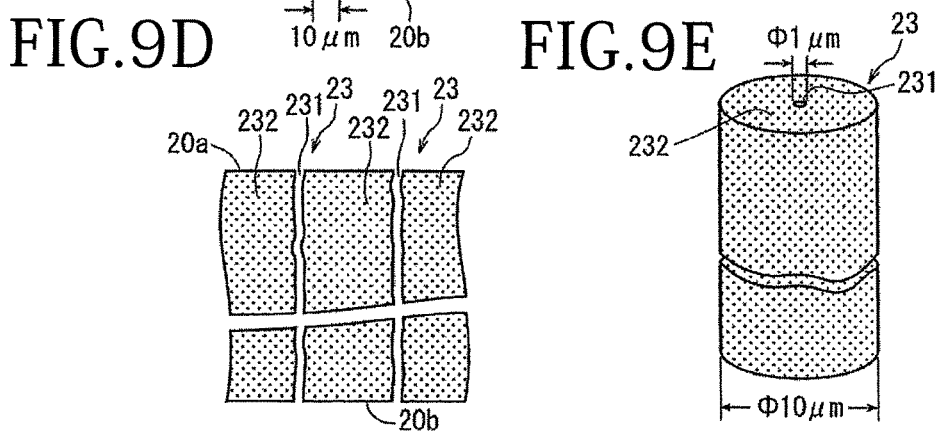

PROCESSING METHOD OF SINGLE-CRYSTAL SUBSTRATE

BACKGROUND OF THE INVENTION

Field of the Invention

The present invention relates to a processing method of a single-crystal substrate such as a sapphire ($Al_2O_3$) substrate, a silicon carbide (SiC) substrate, a gallium nitride (GaN) substrate, a lithium tantalate ($LiTaO_3$) substrate, a lithium niobate ($LiNbO_3$) substrate, a diamond substrate, a quartz substrate, or the like.

Description of the Related Art

In an optical device fabrication process, an optical device layer made up of an n-type nitride semiconductor layer and a p-type nitride semiconductor layer is stacked on the front side of a sapphire ($Al_2O_3$) substrate, a silicon carbide (SiC) substrate, or a gallium nitride (GaN) substrate, and optical devices such as light-emitting diodes, laser diodes, or the like are formed in a plurality of regions divided by a plurality of division lines formed in a grid pattern on the optical device layer, thereby producing an optical device wafer. Then, a laser beam is applied to the optical device wafer along the division lines to cut the optical device wafer, dividing the regions with the optical devices formed therein thereby to manufacture individual optical devices. A SAW wafer with SAW devices formed on the front side of a lithium tantalate ($LiTaO_3$) substrate, a lithium niobate ($LiNbO_3$) substrate, a silicon carbide (SiC) substrate, a diamond substrate, or a quartz substrate is also cut into individual SAW devices by a laser beam applied to the SAW wafer along division lines.

As a method of dividing wafers such as optical device wafers and SAW wafers as described above, there has been tried a laser processing method that uses a pulsed laser beam having a wavelength which permeates through the workpiece, wherein the pulsed laser beam is applied to the workpiece while positioning a converged point thereof within an area to be divided. A dividing method using such a laser processing method is a technology for dividing a wafer by applying a pulsed laser beam having a wavelength which permeates through the wafer from one surface thereof while positioning a converged point thereof within the wafer thereby to form a succession of modified layers serving as rupture start points along a division line within the workpiece and exerting an external force on the wafer along a street where the strength is lowered by the modified layers (see, for example, Japanese Patent No. 3408805).

Furthermore, as a method of dividing a wafer such as a semiconductor wafer, an optical device wafer, or the like along a division line, there has been put to practical use a technology for performing an ablation process on a wafer by irradiating the wafer with a pulsed laser beam having a wavelength absorbable by the wafer along a division line thereby to form laser-processed grooves, and exerting an external force on the wafer along the division line where the laser-processed grooves have been formed as rupture start points, thereby splitting the wafer (see, for example, Japanese Patent Laid-Open No. Hei10-305420).

SUMMARY OF THE INVENTION

However, either one of the above processing methods is problematic in that the productivity is poor because in order to divide an optical device wafer made of a sapphire ($Al_2O_3$) substrate or the like along a division line into individual devices, it is necessary to apply a laser beam to the same division line a plurality of times.

Moreover, a single-crystal substrate where an optical device layer (film) made up of an n-type nitride semiconductor layer and a p-type nitride semiconductor layer is formed on the front side thereof or where a metal film and a DBR film are stacked on the back side thereof requires to be subjected a desired laser-process without being affected by the films.

It is therefore an object of the present invention to provide a processing method of a single-crystal substrate with a film formed on the front side or reverse side thereof in a manner to be able to laser-process the single-crystal substrate reliably to a desired thickness.

In accordance with an aspect of the present invention, there is provided a processing method of a single-crystal substrate having a film formed on a front side or a back side thereof to divide the single-crystal substrate along a plurality of preset division lines. The processing method includes a film removing step of removing the film formed on the single-crystal substrate along the division lines, a shield tunnel forming step of applying a pulsed laser beam having a wavelength which permeates through the single-crystal substrate along the division lines to form shield tunnels, each shield tunnel including a fine hole and an amorphous region shielding the fine hole, in the single-crystal substrate along the division lines after performing the film removing step, and dividing step of exerting an external force on the single-crystal substrate to which the shield tunnel forming step is performed to divide the single-crystal substrate along the division lines in which the shield tunnels are formed. The pulsed laser beam is applied from a side of the single-crystal substrate where the film is formed, through regions where the film is removed in the shield tunnel forming step.

Preferably, the film removing step is performed by a cutting blade with an annular cutter on an outer circumference thereof. Alternatively, the film removing step may be performed by etching.

Preferably, a permeable film coating step is performed after performing the film removing step. In this step, the regions where the film is removed are coated with a permeable film that is permeable to the wavelength of the pulsed laser beam. Preferably, the pulsed layer beam used in the shield tunnel forming step has a peak energy density set to a value in a range from 1 $TW/cm^2$ to 100 $TW/cm^2$.

In the processing method of a single-crystal substrate according to the present invention, the film removing step is performed by removing the film deposited on the single-crystal substrate along the division lines, the pulsed laser beam whose wavelength permeates through the single-crystal substrate is applied along the division lines from the side of the single-crystal substrate where the film has been formed through regions where the film has been removed to form shield tunnels, each including a fine hole and an amorphous region shielding the fine hole, in the single-crystal substrate along the division lines. Therefore, the shield tunnels can reliably be formed in the single-crystal substrate even if the film is deposited on the front side or the back side of the single-crystal substrate, thereby allowing the single-crystal substrate to be divided reliably into individual chips.

In the event that the permeable film coating step is performed by coating the regions where the film is removed along the division lines with a permeable film after performing the film removing step and before performing the shield tunnel forming step, then even if an upper surface of the region of the single-crystal substrate where the film has been removed along the division lines is in a state which prevents the pulsed laser beam from passing through the single-crystal substrate (e.g., even if the surface of the film is roughened or the upper surface of the single-crystal substrate has a plurality of minute projections and depressions referred to as a PSS structure), the permeable film allows the pulsed laser beam to pass through the single-crystal substrate, so that shield tunnels can reliably be formed therein.

The above and other objects, features and advantages of the present invention and the manner of realizing them will become more apparent, and the invention itself will best be understood from a study of the following description and appended claims with reference to the attached drawings illustrating some preferred embodiments of the invention.

BRIEF DESCRIPTION OF THE DRAWINGS

FIGS. 9A through 9E are views illustrating a shield tunnel forming step according to a first embodiment of the present invention;

DETAILED DESCRIPTION OF THE PREFERRED EMBODIMENTS

Figure 1A:
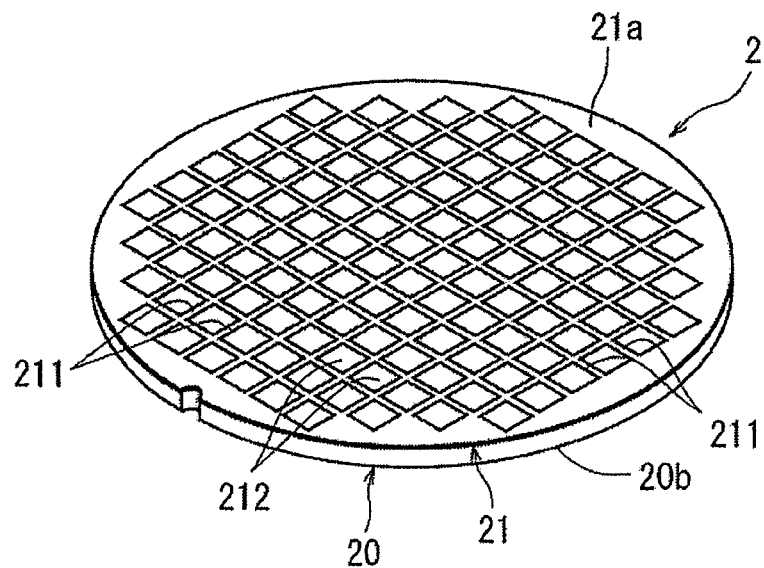
FIG. 1A is a perspective view of an optical device wafer wherein an optical device layer is formed on a single-crystal substrate.
Figure 1B:
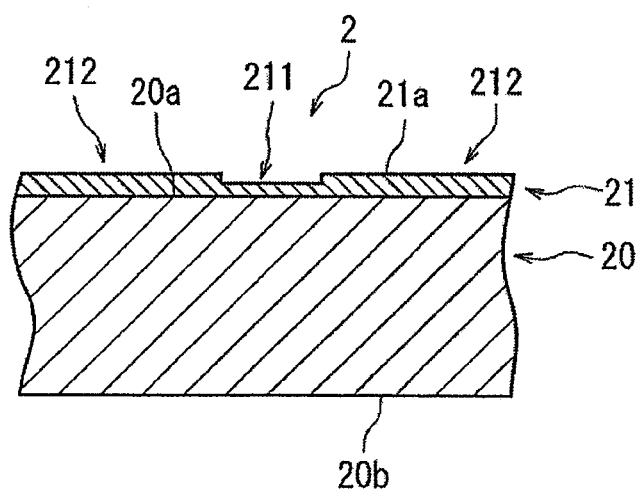
FIG. 1B is an enlarged fragmentary cross-sectional view of the optical device wafer illustrated in FIG. 1A.

Methods of processing a single-crystal substrate according to preferred embodiments of the present invention will be described in detail below with reference to the accompanying drawings. FIG. 1A illustrates in perspective an optical device wafer wherein an optical device layer is formed on a single-crystal substrate, which is to be processed by a processing method of a single-crystal substrate according to an embodiment of the present invention. As illustrated in FIGS. 1A and 1B, an optical device wafer 2 has an optical device layer 21 made up of an n-type gallium nitride semiconductor layer and a p-type gallium nitride semiconductor layer and deposited on the front side 20a of a sapphire ($Al_2O_3$) substrate 20 having a thickness of 400 µm by an epitaxial growth process. The optical device layer 21 includes a matrix of optical devices 212 formed in a plurality of areas that are separated by division lines 211 formed in a grid pattern.

Figure 2:
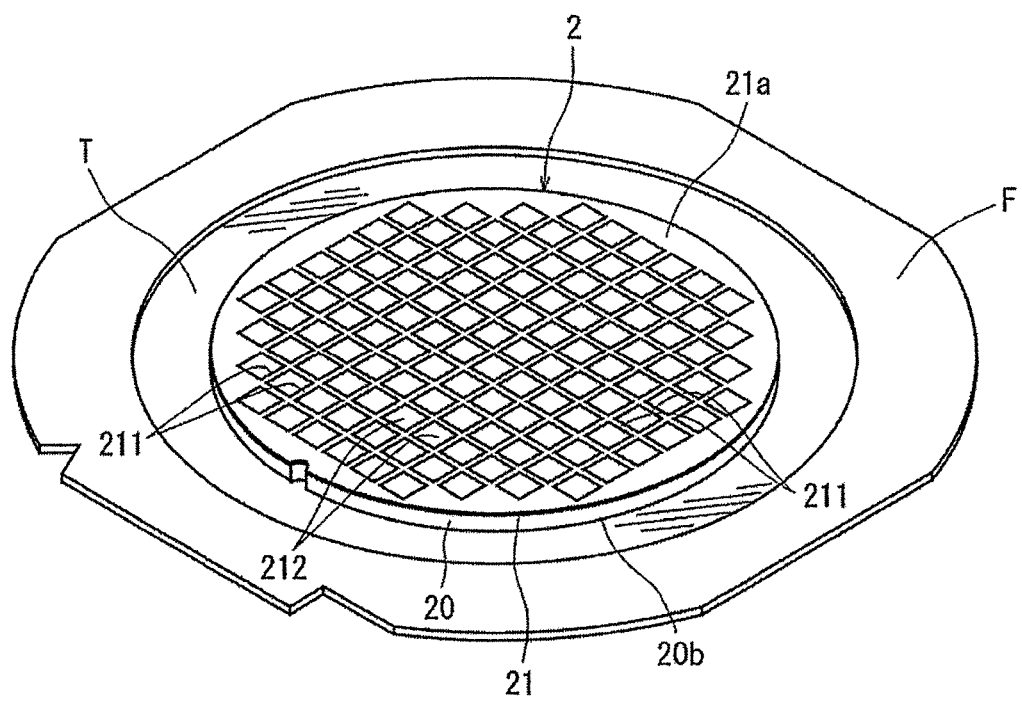
FIG. 2 is a perspective view illustrating the manner in which the optical device wafer illustrated in FIG. 1A is adhered to a dicing tape mounted on an annular frame.

In the processing method of a single-crystal substrate according to the present embodiment, a wafer supporting step wherein the optical device wafer 2 is adhered to the upper side of a dicing tape mounted on an annular frame is initially carried out. Specifically, as illustrated in FIG. 2, the back side 20b of the optical device wafer 2 is adhered to the upper side of a dicing tape T whose outer circumferential portion has been mounted on an annular frame F in covering relation to an inner opening thereof. With the optical device wafer 2 adhered to the upper side of the dicing tape T, therefore, the optical device layer 21 has its front side 21a facing upwardly.

Figure 3:
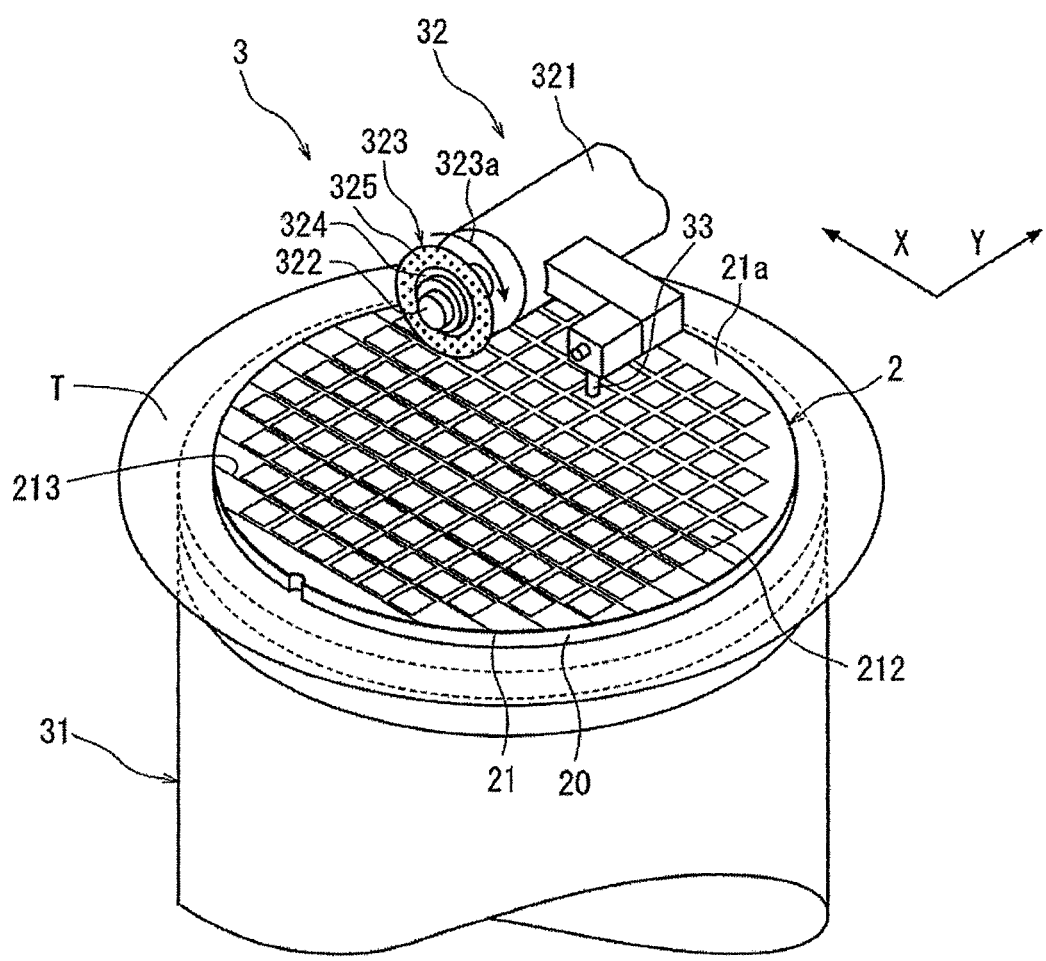
FIG. 3 is a perspective view of essential parts of a cutting apparatus for carrying out a film removing step.

After the wafer supporting step has been carried out, a film removing step is carried out to remove the optical device layer 21 which has been deposited as a film on the front side 20a of the sapphire ($Al_2O_3$) substrate 20, which is a single-crystal substrate, along division lines. According to the present embodiment, the film removing step is performed using a cutting apparatus 3 illustrated in FIG. 3. As illustrated in FIG. 3, the cutting apparatus 3 has a chuck table 31 that holds a workpiece thereon, cutting means 32 for cutting the workpiece that is held on the chuck table 31, and imaging means 33 that images the workpiece held on the chuck table 31. The chuck table 31, which is arranged to hold the workpiece under suction, is movable along a feeding direction indicated by the arrow X in FIG. 3 by feeding means, not illustrated, and along an indexing direction indicated by the arrow Y in FIG. 3 by indexing means, not illustrated.

The cutting means 32 includes a spindle housing 321 disposed substantially horizontally, a rotational spindle 322 rotatably supported by the spindle housing 321, and a cutting blade 323 mounted on the distal end of the rotational spindle 322. The rotational spindle 322 is rotated about its own axis in the direction indicated by the arrow 323a by servomotor, not illustrated, housed in the spindle housing 321. The cutting blade 323 includes a disk-shaped base 324 made of a metal material such as aluminum or the like, and an annular cutter 325 mounted on the outer circumferential side of the base 324. The annular cutter 325 includes an electroformed blade disposed on the outer circumferential side of the base 324 and made of abrasive grains of diamond having particle diameters in the range from 3 to 4 µm and held together by nickel plating. According to the present embodiment, the annular cutter 325 has a thickness of 30 µm and an outside diameter of 50 mm.

The imaging means 33, which is mounted on a distal end portion of the spindle housing 321, includes, illuminating means for illuminating the workpiece, an optical system for optically creating an image of the area of the workpiece illuminated by the illuminating means, and an imaging device (CCD) for capturing the image optically created by the optical system. The imaging means 33 sends a captured image signal to control means, not illustrated.

For carrying out the film removing step using the cutting apparatus 3, the dicing tape T to which the optical device wafer 2 has been adhered in the wafer supporting step is placed on the chuck table 31, as illustrated in FIG. 3. Suction means, not illustrated, is actuated to hold the optical device wafer 2 on the chuck table 31 under suction through the intermediary of the dicing tape T (wafer holding step). Therefore, the optical device layer 21 of the optical device wafer 2 held on the chuck table 31 has its front side 21a facing upwardly. The annular frame F with the dicing tape T mounted thereon, which is omitted from illustration in FIG. 3, is held by appropriate frame holding means disposed on the chuck table 31. The chuck table 31 which has thus held the optical device wafer 2 under suction is positioned immediately below the imaging means 33 by the feeding means, not illustrated.

When the chuck table 31 is positioned immediately below the imaging means 33, the imaging means 33 and the non-illustrated control means carry out an alignment process to detect an area to be laser-processed of the optical device wafer 2. Specifically, the imaging means 33 and the non-illustrated control means perform an image processing process such as pattern matching or the like to position a division line 211 along a predetermined direction on the optical device wafer 2 in alignment with the cutting blade 323, thereby aligning the area to be cut by the cutting blade 323 (alignment step). The area to be cut by the cutting blade 323 is also similarly aligned with a division line 211 that extends on the optical device wafer 2 perpendicularly to the above predetermined direction.

After the division lines 211 on the optical device wafer 2 held on the chuck table 31 have been detected and the area to be cut has been aligned, the chuck table 31 which is holding the optical device wafer 2 is moved to a position where the area to be cut starts to be cut. At this time, as illustrated in FIG. 4A, one end (left end in FIG. 4A) of the division line 211 to be cut on the optical device wafer 2 is positioned at a location that is spaced a predetermined distance rightwardly from the position immediately below the cutting blade 323.

Figure 4A:
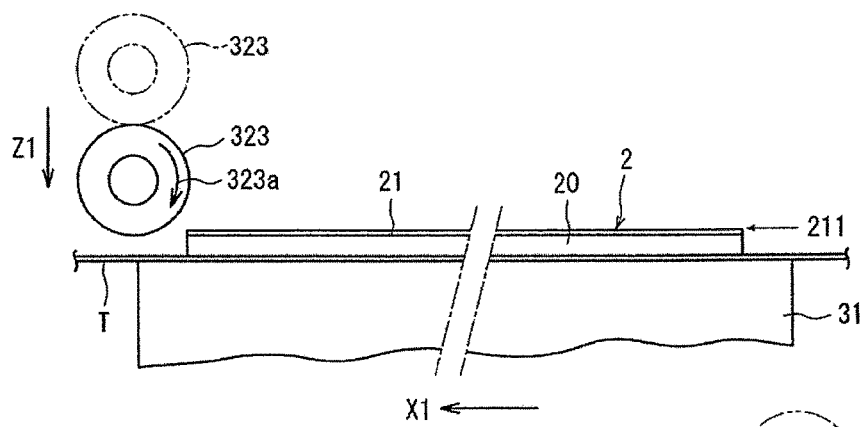
FIGS. 4A through 4D are views illustrating the film removing step.

After the optical device wafer 2 held on the chuck table 31 of the cutting apparatus 3 has been positioned at a cut start position of the area to be cut, the cutting blade 323 is advanced downwardly along the direction indicated by the arrow Z1 from a standby position indicated by the two-dot-and-dash lines in FIG. 4A, and positioned at a predetermined cut-in position indicated by the solid lines in FIG. 4A. As illustrated in FIGS. 4A and 4C, the cut-in position refers to a position where the cutting blade 323 has its lower end reaching the front side 20a of the sapphire ($Al_2O_3$) substrate 20 of the optical device wafer 2.

Then, the cutting blade 323 is rotated about its own axis at a predetermined rotational speed in the direction indicated by the arrow 323a in FIG. 4A, and the chuck table 31 is moved or fed at a predetermined feed speed along the division line 211 in the direction indicated by the arrow X1 in FIG. 4A. When the other end (right end in FIG. 4B) of the division line 211 reaches a position that is spaced a predetermined distance leftwardly from the position immediately below the cutting blade 323, the chuck table 31 stops moving. When the chuck table 31 is thus fed along the division line 211, a cut groove 213 is formed that reaches the front side 20a of the sapphire ($Al_2O_3$) substrate 20 in the optical device layer 21 of the optical device wafer 2 along the division line 211, as illustrated in FIG. 4D. As a result, a portion of the optical device layer 21 as the film deposited on the front side 20a of the sapphire ($Al_2O_3$) substrate 20 as the single-crystal substrate is removed along the division line 211 (film removing step).

Figure 4B:
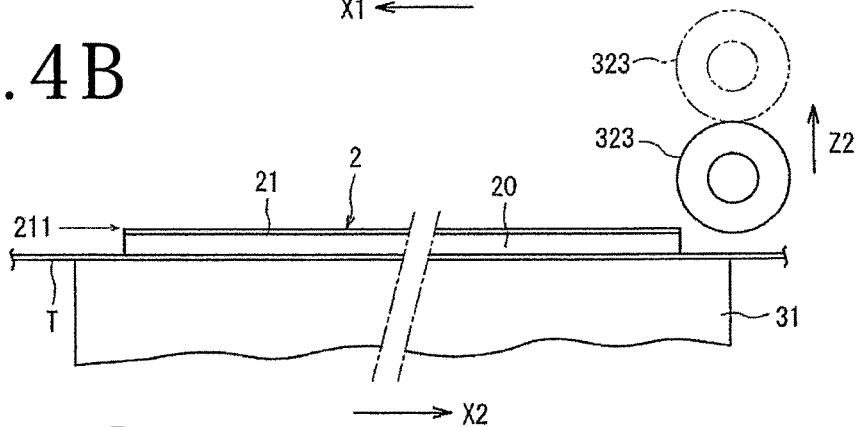
Figure 4C:
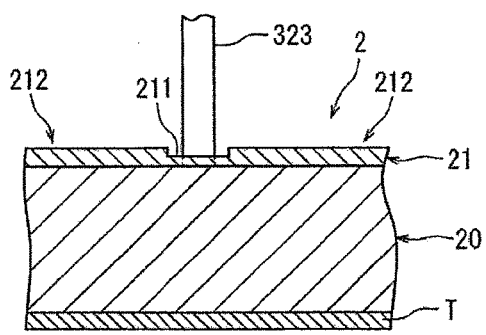
Figure 4D:
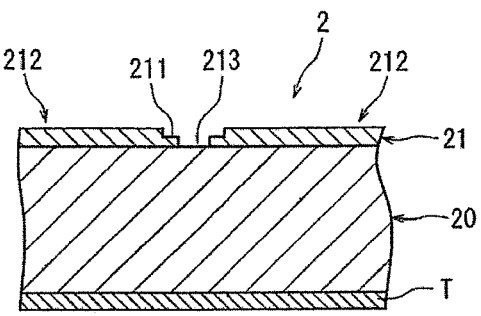

Then, the cutting blade 323 is lifted along the direction indicated by the arrow Z2 in FIG. 4B back to the standby position indicated by the two-dot-and-dash lines in FIG. 4B, and the chuck table 31 is moved in the direction indicated by the arrow X2 in FIG. 4B back to the position illustrated in FIG. 4A. Thereafter, the chuck table 31 is fed in a direction normal to the sheet of FIGS. 4A and 4B (indexing direction) by a distance corresponding to the interval between two adjacent division lines 211, positioning a next division line 211 along which to cut the optical device wafer 2 in alignment with the cutting blade 323. After the next division line 211 has been positioned in alignment with the cutting blade 323, the above film removing step is carried out again. The film removing step is performed along all the division lines 211 on the optical device wafer 2.

The film removing step is carried out under the following processing conditions, for example:

Cutting blade: an outside diameter of 50 mm and a thickness of 30 μm

Rotational speed of the cutting blade: 20000 rpm

Feed speed: 50 mm/second

Figure 5A:
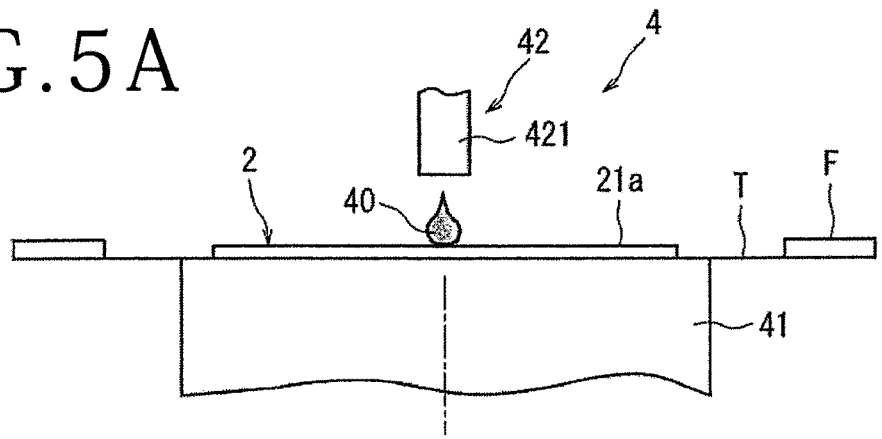
FIGS. 5A through 5C are views illustrating a permeable film coating step.

After the above film removing step has been performed, a permeable film coating step is carried out to coat the wafer region from which the film has been removed with a permeable film that is permeable to the wavelength (e.g., 1030 nm) of a pulsed laser beam to be described below. The permeable film coating step is carried out using a permeable film coating apparatus 4 illustrated in FIG. 5A. Specifically, the optical device wafer 2 on which the film removing step has been carried out is placed on a spinner table 41 of the permeable film coating apparatus 4 through the intermediary of the dicing tape T. Then, suction means, not illustrated, is actuated to hold the optical devices 212 on the spinner table 41 under suction through the intermediary of the dicing tape T. Therefore, the optical device layer 21 of the optical device wafer 2 held on the spinner table 41 has its front side 31a facing upwardly. The annular frame F is secured in position by clamps, not illustrated, disposed on the spinner table 41. Then, a predetermined amount of permeable film forming liquid 40 is dropped onto a central area of the front side 21a of the optical device layer 21 of the optical device wafer 2 from a resin supply nozzle 421 of resin liquid supply means 42 which is disposed above the spinner table 41. The permeable film forming liquid 40 may include polyvinyl alcohol (PVA), polyallylamine (PAA), polyethyleneimine (PEI), edible oil, machine oil, or the like.

Figure 5B:
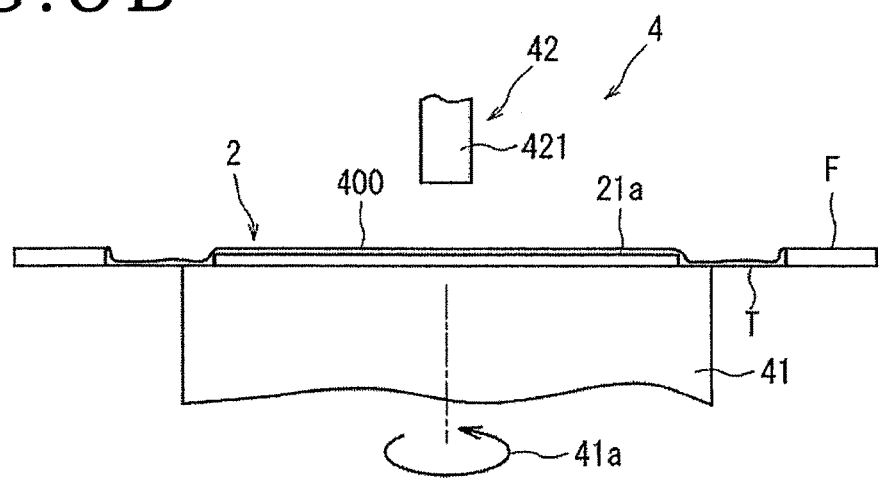
Figure 5C:
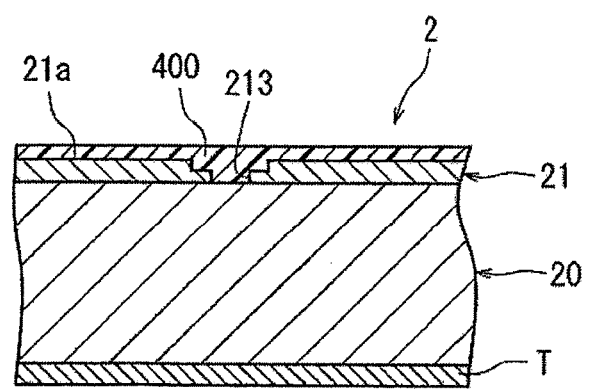

After the predetermined amount of permeable film forming liquid 40 has been dropped onto the central area of the front side 21a of the optical device layer 21 of the optical device wafer 2, the spinner table 41 is rotated about its own axis at a rotational speed of 100 rpm, for example, for five seconds in the direction indicated by the arrow 41a, as illustrated in FIG. 5B. As a result, the dropped permeable film forming liquid 40 flows radially outwardly under the action of centrifugal forces and spreads all over the front side 21a of the optical device layer 21, covering the wafer region from which the film has been removed by the cut groove 213 formed in the optical device layer 21 along each of the division lines 211, with a permeable film 400 which is permeable to the wavelength (e.g., 1030 nm) of a pulsed laser beam to be described below, as illustrated in FIG. 5C.

Figure 6:
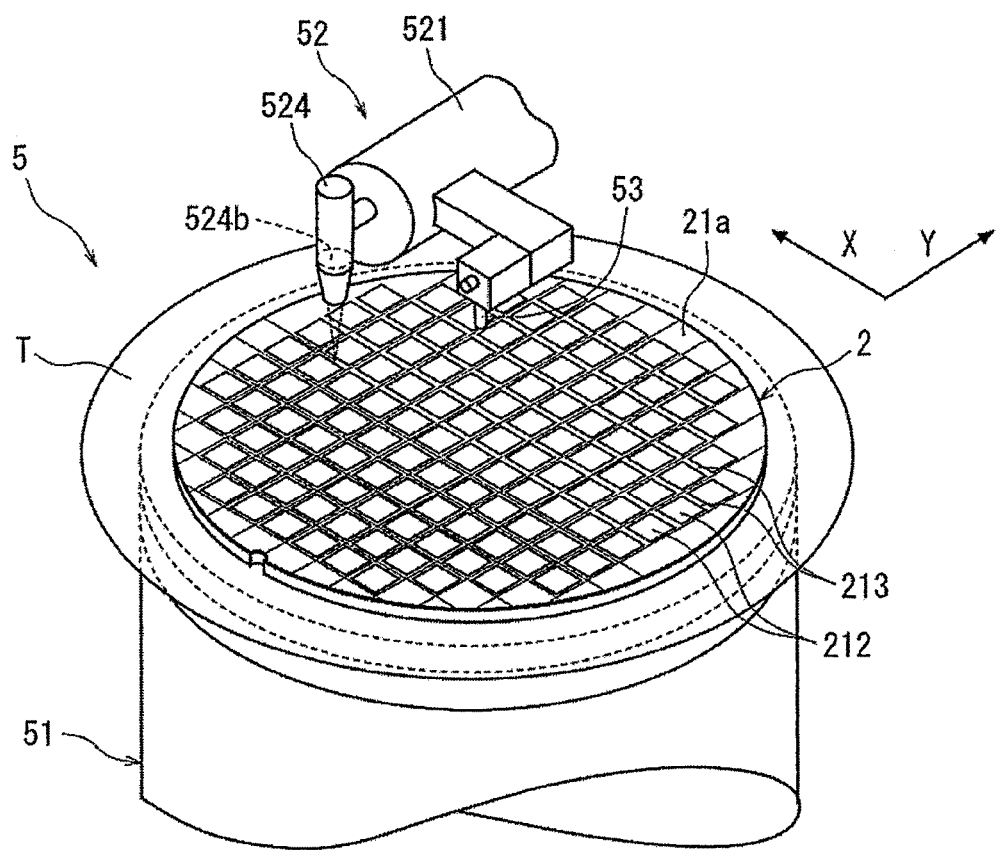
FIG. 6 is a perspective view of essential parts of a laser processing apparatus for performing a shield tunnel forming step.

Then, a shield tunnel forming step is carried out to apply a pulsed layer beam having such a wavelength that it permeates through the sapphire ($Al_2O_3$) substrate 20 to the optical device wafer 2 along the division lines 211, forming shield tunnels, each including a fine hole and an amorphous region shielding the fine hole, along the division lines 211. According to the present embodiment, the shield tunnel forming step is performed using a laser processing apparatus 5 illustrated in FIG. 6. As illustrated in FIG. 6, the laser processing apparatus 5 includes a chuck table 51 that holds a workpiece thereon, laser beam applying means 52 that applies a laser beam to the workpiece held on the chuck table 51, and imaging means 53 that images the workpiece held on the chuck table 51. The chuck table 51, which is arranged to hold the workpiece under suction, is movable along a feeding direction indicated by the arrow X in FIG. 6 by feeding means, not illustrated, and along an indexing direction indicated by the arrow Y in FIG. 6 by indexing means, not illustrated.

Figure 7:
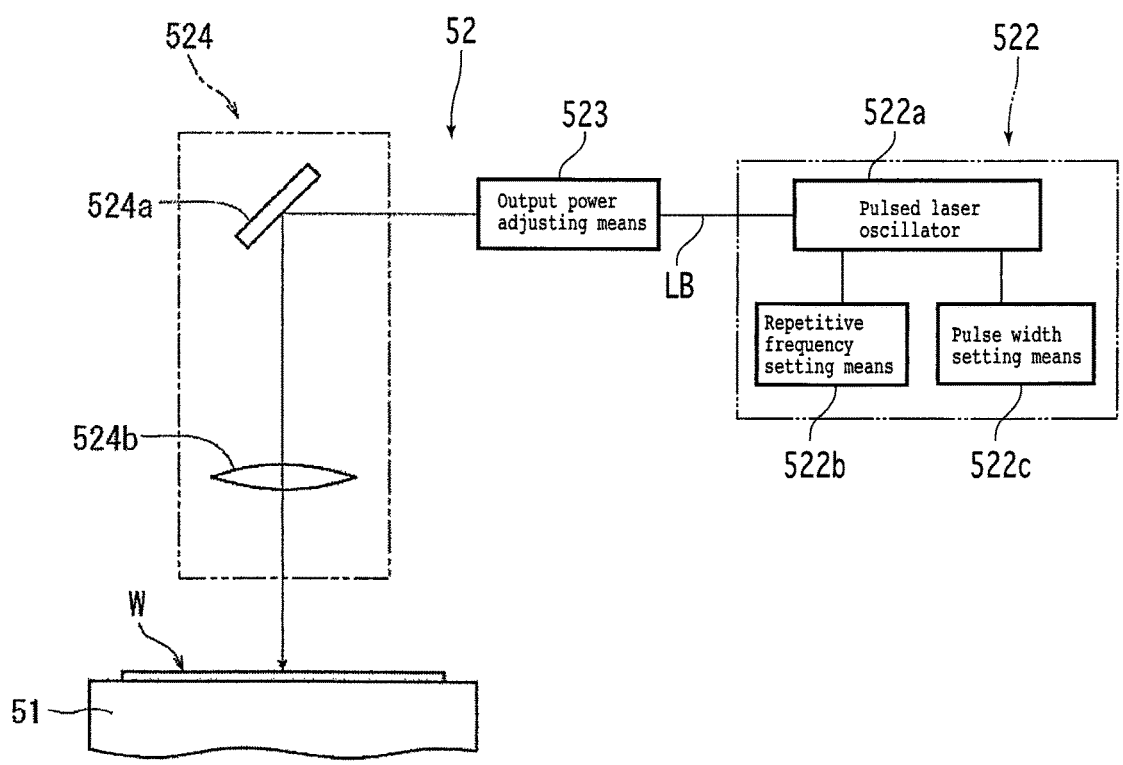
FIG. 7 is a block diagram of a pulsed laser beam oscillating means included in the laser processing apparatus illustrated in FIG. 6.

The laser beam applying means 52 includes a casing 521 of a hollow cylindrical shape extending essentially horizontally. As illustrated in FIG. 7, the laser beam applying means 52 has pulsed laser beam oscillating means 522 disposed in the casing 521, output power adjusting means 523 for adjusting the output power of a pulsed laser beam oscillated from the pulsed laser beam oscillating means 522, and a converging unit or condenser 524 for converging the pulsed laser beam whose output power has been adjusted by the output power adjusting means 523 and applying the converged pulsed laser beam to the optical device wafer 2 which is held as the workpiece on a holding surface that is provided as the upper surface of the chuck table 51. The pulsed laser beam oscillating means 522 includes a pulsed laser oscillator 522a, repetitive frequency setting means 522b for setting a repetitive frequency for the pulsed laser beam oscillated by the pulsed laser oscillator 522a, and pulse width setting means 522c for setting the pulse width for the pulsed laser beam oscillated by the pulsed laser oscillator 522a. According to the present embodiment, the pulsed laser beam oscillating means 522 thus arranged oscillates a pulsed laser beam LB having a wavelength of 1030 nm. The pulsed laser beam oscillating means 522 and the output power adjusting means 523 are controlled by control means, not illustrated.

The converging unit 524 includes a direction changing mirror 524a for changing the direction of the pulsed laser beam LB downwardly which has been emitted from the pulsed laser beam oscillating means 522 and whose output power has been adjusted by the output power adjusting means 523, and a condensing lens 524b for converging the pulsed laser beam LB which has been changed in direction by the direction changing mirror 524a and applying the converged pulsed laser beam to the workpiece W held on the holding surface as the upper surface of the chuck table 51. The present inventor has confirmed that a shield tunnel is formed insofar as a value generated by dividing the numerical aperture (NA) of the condensing lens 524b of the converging unit 524 by the refractive index (N) of the single-crystal substrate is in the range from 0.05 to 0.4. The relationship among the numerical aperture (NA), the refractive index (N), and the value (S=NA/N) generated by dividing the numerical aperture (NA) by the refractive index (N) will be described below with reference to FIG. 8.

Figure 8:
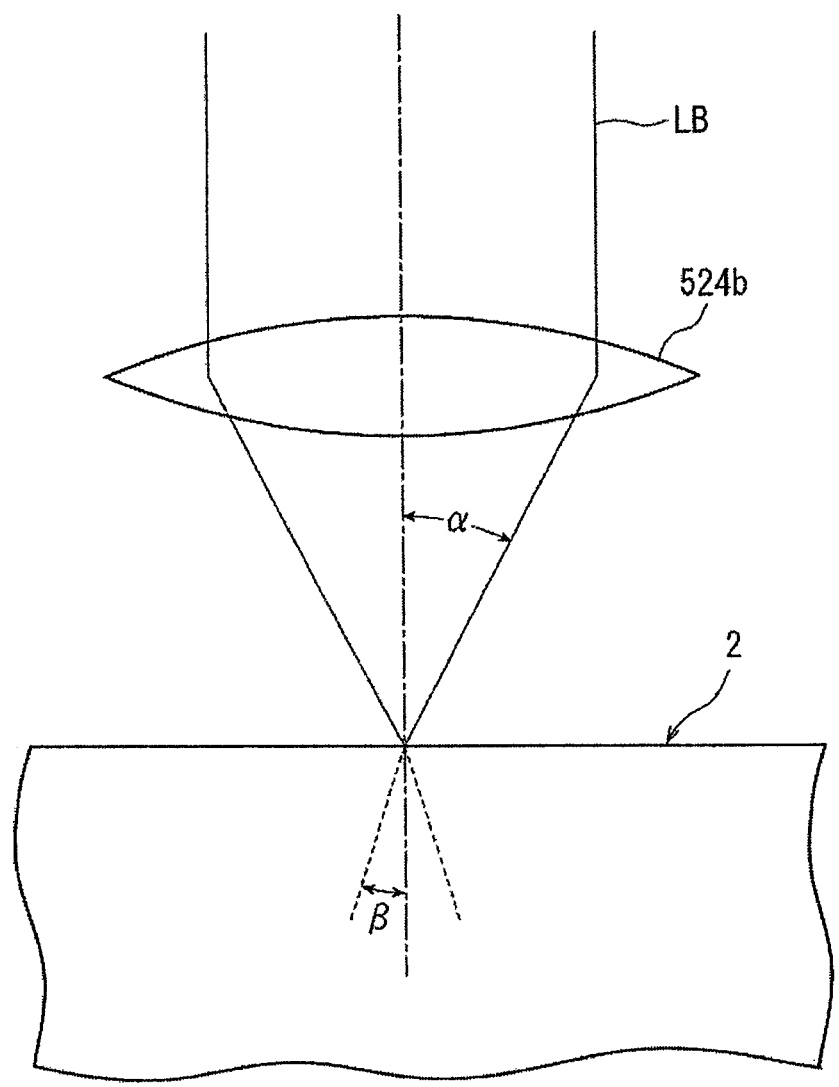
FIG. 8 is a diagram illustrating the relationship among the numerical aperture (NA) of a condensing lens, the refractive index (N) of an optical device wafer, and a value (S=NA/N) generated by dividing the numerical aperture (NA) by the refractive index (N)

In FIG. 8, the pulsed laser beam LB applied to the condensing lens 524b is converged at an angle ($\alpha$) with respect to the optical axis of the condensing lens 524b. At this time, sin $\alpha$ represents the numerical aperture (NA) of the condensing lens 524b (NA=sin $\alpha$). When the pulsed laser beam LB converged by the condensing lens 524b is applied to the optical device wafer 2 which includes the single-crystal substrate, since the single-crystal substrate of the optical device wafer 2 has its density higher than air, the pulsed laser beam LB is refracted from the angle ($\alpha$) to an angle ($\beta$). At this time, the angle ($\beta$) with respect to the optical axis differs depending on the refractive index (N) of the single-crystal substrate of the optical device wafer 2. As the refractive index (N) is expressed as (N=sin $\alpha$/sin $\beta$), the value (S=NA/N) generated by dividing the numerical aperture (NA) by the refractive index (N) of the single-crystal substrate is represented by sin $\beta$. It has been experimentally confirmed that a good shield tunnel is formed by setting sin $\beta$ to the range from 0.05 to 0.4 (0.05≤sin $\beta$≤0.4), and that no good shield tunnel is formed if sin $\beta$ falls outside the set range even though the peak energy density is in its desired range. The laser beam applying means 52 has a converged point position adjusting means, not illustrated, for adjusting the position of the converged point of the pulsed laser beam that is converged by the condensing lens 524b of the converging unit 524.

The imaging means 53, which is mounted on a distal end portion of the casing 521 of the laser beam applying means 52, includes, other than an ordinary imaging device (CCD) which images with visible light, infrared light applying means for applying infrared light to the workpiece, an optical system for capturing the infrared light applied by the infrared light applying means, and an imaging device (infrared CCD) for outputting an electric signal depending on the infrared light captured by the optical system. The imaging means 53 sends a captured image signal to the control means, not illustrated.

A shield tunnel forming step according to a first embodiment of the present invention, which is to be carried out using the above laser processing apparatus 5, will be described below with reference to FIGS. 6 and 9A through 9E. The shield tunnel forming step according to the first embodiment is carried out on the optical device wafer 2 on which the film removing step has been performed and the permeable film covering step has not been performed.

The dicing tape T to which the optical device wafer 2 has been adhered is placed on the chuck table 51 of the above-described laser processing apparatus 5 illustrated in FIG. 6. Suction means, not illustrated, is actuated to hold the optical device wafer 2 on the chuck table 51 under suction through the intermediary of the dicing tape T (wafer holding step). Therefore, the optical device layer 21 of the optical device wafer 2 held on the chuck table 51 has its front side 21a facing upwardly. The annular frame F with the dicing tape T mounted thereon, which is omitted from illustration in FIG. 6, is held by appropriate frame holding means disposed on the chuck table 51. The chuck table 51 which has thus held the optical device wafer 2 under suction is positioned immediately below the imaging means 53 by feeding means, not illustrated.

When the chuck table 51 is positioned immediately below the imaging means 53, the imaging means 53 and the non-illustrated control means carry out an alignment process to detect an area to be laser-processed of the optical device wafer 2. Specifically, the imaging means 53 and the non-illustrated control means perform an image processing process such as pattern matching or the like to position a cut groove 213 formed along a division line 211 along a first direction on the optical device wafer 2 and the converging unit 524 of the laser beam applying means 52 which applies the laser beam along the division line 211, with respect to each other, thereby aligning a laser beam applying position (alignment step). A laser beam applying position is similarly aligned with respect to a cut groove 213 formed along a division line 211 that extends on the optical device wafer 2 perpendicularly to the above first direction.

After the above alignment step has been carried out, as illustrated in FIG. 9A, the chuck table 51 is moved to a laser beam applying area where the converging unit 524 of the laser beam applying means 52 that applies the laser beam is positioned, positioning the cut groove 213 formed along a predetermined division line 211 immediately below the converging unit 524. At this time, as illustrated in FIG. 9A, one end (left end in FIG. 9A) of the division line 211 on the optical device wafer 2 is positioned immediately below the converging unit 524. Then, the non-illustrated converged point position adjusting means is actuated to move the converging unit 524 along the optical axis in order to position a converged point P of the pulsed laser beam LB converged by the condensing lens 524b of the converging unit 524 at a desired position along the thickness-wise direction from the front side 20a of the sapphire ($Al_2O_3$) substrate 20 as the single-crystal substrate (positioning step). According to the present embodiment, the converged point P of the pulsed laser beam LB on the optical device wafer 2 is set to the desired position that is spaced from the front side 20a of the sapphire ($Al_2O_3$) substrate 20 to which the pulsed laser beam LB is applied (e.g., a position spaced 5 through 10 μm from the front side 20a toward the back side 20b).

After the positioning step has been carried out as described above, a shield tunnel forming step is carried out to operate the laser beam applying means 52 to emit the laser beam LB from the converging unit 524 and form, in the sapphire ($Al_2O_3$) substrate 20, a fine hole and an amorphous region shielding the fine hole which extend from a region in the vicinity of the converged point P (front side 20a) toward the back side 20b, thereby forming a shield tunnel in the sapphire ($Al_2O_3$) substrate 20 as the single-crystal substrate forming the optical device wafer 2. Specifically, while the converging unit 524 emits the pulsed laser beam LB which has a wavelength which permeates through the sapphire ($Al_2O_3$) substrate 20 of the optical device wafer 2, the chuck table 51 is moved at a predetermined feed speed along the direction indicated by the arrow X1 in FIG. 9A (shield tunnel forming step). Then, as illustrated in FIG. 9B, when the other end (right end in FIG. 9B) of the cut groove 213 reaches the laser beam applying position of the converging unit 524 of the laser beam applying means 52, the laser beam applying means 52 stops applying the pulsed laser beam LB, and the chuck table 51 stops moving.

When the above shield tunnel forming step is carried out, as illustrated in FIG. 9C, fine holes 231 and amorphous regions 232 formed in the region surrounding the fine holes 231 are grown in the optical device wafer 2 such that the fine holes 231 and the amorphous regions 232 extend from a region in the vicinity of the converged point P (front side 20a) of the pulse layer beam LB toward the back side 20b, thereby forming amorphous shield tunnels 23 at predetermined intervals (according to the present embodiment, intervals of 10 μm (work feed speed: 1000 mm/second)/(repetitive frequency: 100 kHz)) along the cut groove 213 formed along the division line 211. As illustrated in FIGS. 9D and 9E, each of the shield tunnels 23 includes a centrally formed fine hole 231 having a diameter of approximately 1 μm and an amorphous region 232 having a diameter of approximately 10 μm disposed in the region surrounding the fine hole 231. According to the present embodiment, those amorphous regions 232 which are disposed adjacent to each other are joined to each other. Since the amorphous shield tunnels 23 formed in the shield tunnel forming step can be formed so as to extend from the front side 20a of the optical device wafer 2 toward the back side 20b thereof, the pulsed laser beam LB may be applied only once even if the thickness of the sapphire substrate 20 is large. Therefore, the productivity of the shield tunnels 23 is highly increased. Furthermore, as no debris is scattered in the shield tunnel forming step, the problem of a reduced device quality is also solved.

After the shield tunnel forming step is carried out along the grooves 213 along the predetermined division line 211 as described above, the chuck table 51 is indexed by the interval between division lines 211 on the optical device wafer 2 along the direction indicated by the arrow Y (indexing step), and then the above shield tunnel forming step is performed. When the shield tunnel forming step has been carried out along the grooves 213 along all the division lines 211 that extend along the first direction in this manner, the chuck table 51 is rotated 90 degrees, and then the shield tunnel forming step is carried out along the grooves 213 formed along the division lines 211 which extend in a direction perpendicular to the grooves 213 along the division lines 211 in the first direction.

Figure 10:
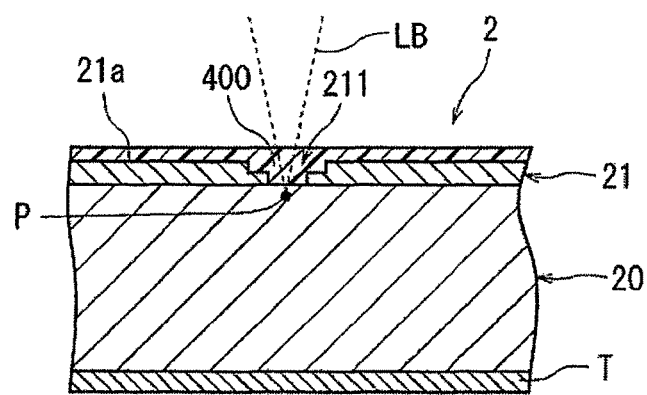
FIG. 10 is a view illustrating a shield tunnel forming step according to a second embodiment of the present invention.

A shield tunnel forming step according to a second embodiment of the present invention will be described below with reference to FIG. 10. The shield tunnel forming step according to the second embodiment is carried out on the optical device wafer 2 on which the film removing step has been performed and then the permeable film covering step is performed. According to the second embodiment, specifically, the region of the optical device wafer 2 where the optical device layer 21 has been removed along the division lines 211 in the film removing step is irradiated with the pulse layer beam LB through the permeable film 400 which has been deposited on the region of the optical device wafer 2, as illustrated in FIG. 10. Even if the upper surface of the region of the optical device wafer 2 where the optical device layer 21 has been removed along the division lines 211 is in a state which prevents the pulsed laser beam LB from passing through the optical device wafer 2 (e.g., even if the upper surface of the optical device layer 21 is roughened or the upper surface of the sapphire ($Al_2O_3$) substrate 20 has a plurality of minute projections and depressions referred to as a PSS structure), the permeable film 400 allows the pulsed laser beam LB to pass through the optical device wafer 2, so that shield tunnels can reliably be formed therein.

In order to form good shield tunnels 23 in the above shield tunnel forming step, it is important to set the peak energy density of the pulsed laser beam LB to a value in a range from 1 TW/cm$^2$ to 100 TW/cm$^2$. The peak energy density can be determined as average output power (W)/{repetitive frequency (Hz)×spot area (cm$^2$)×pulse width (s)}.

The reasons why the peak energy density of the pulsed laser beam LB is set to a value in the range from 1 TW/cm$^2$ to 100 TW/cm$^2$ will be described below.

[Experiment 1]

Condition 1 . . . single-crystal substrate: sapphire substrate (having a thickness of 400 μm)

Condition 2 . . . the wavelength of the pulsed laser beam is set to 1030 nm.

Condition 3 . . . the repetitive frequency of the pulsed laser beam is set to 100 kHz.

Condition 4 . . . the spot diameter of the pulsed laser beam is set to 10 μm.

Condition 5 . . . the average output power of the pulsed laser beam is set to 5 W.

Condition 6 . . . variable: the pulse width of the pulsed laser beam

The pulsed laser beam was applied to the sapphire substrate while the pulse width was varied from 0.1 to 100 ps under the above conditions, and the processed state was observed.

When the pulse width ranged from 0.1 to 0.6 ps, voids were formed within the sapphire substrate.

When the pulse width ranged from 0.7 to 63 ps, shield tunnels including fine holes and amorphous regions shielding the fine holes were formed within the sapphire substrate.

When the pulse width ranged from 64 to 100 ps, the inside of the sapphire substrate was melted.

It can be seen from the above experimental results that shield tunnels including fine holes and amorphous regions shielding the fine holes are formed within the sapphire substrate when the pulse width is in the range from 0.7 to 63 ps.

Consequently, the peak energy density is determined with the pulse width in the range from 0.7 to 63 ps under the above conditions, and shield tunnels are formed by setting the peak energy density to a value in the range from 1 $TW/cm^2$ to 100 $TW/cm^2$.

[Experiment 2]

Condition 1 . . . single-crystal substrate: sapphire substrate (having a thickness of 400 μm)

Condition 2 . . . the wavelength of the pulsed laser beam is set to 1030 nm.

Condition 3 . . . the pulse width is set to 10 ps.

Condition 4 . . . the spot diameter of the pulsed laser beam is set to 10 μm.

Condition 5 . . . the average output power of the pulsed laser beam is set to 5 W.

Condition 6 . . . variable: the repetitive frequency of the pulsed laser beam

The pulsed laser beam was applied to the sapphire substrate while the repetitive frequency was varied from 1 to 1000 kHz under the above conditions, and the processed state was observed.

When the repetitive frequency ranged from 1 to 6 kHz, the inside of the sapphire substrate was broken and cracks were radially developed therein.

When the repetitive frequency ranged from 7 to 640 kHz, shield tunnels including fine holes and amorphous regions shielding the fine holes were formed within the sapphire substrate.

When the repetitive frequency ranged from 650 to 1000 kHz, voids were formed within the sapphire substrate and no shield tunnels were formed therein.

It can be seen from the above experimental results that shield tunnels including fine holes and amorphous regions shielding the fine holes are formed within the sapphire substrate when the repetitive frequency is in the range from 7 to 640 kHz.

Consequently, the peak energy density is determined with the repetitive frequency in the range from 7 to 640 kHz under the above conditions, and shield tunnels are formed by setting the peak energy density to a value in the range from 1 $TW/cm^2$ to 100 $TW/cm^2$.

Experiment 1 and Experiment 2 were conducted on the sapphire ($Al_2O_3$) substrate. Experiments similar to Experiment 1 and Experiment 2 were also conducted on a silicon carbide (SiC) substrate, a gallium nitride (GaN) substrate, a lithium tantalate ($LiTaO_3$) substrate, a lithium niobate ($LiNbO_3$) substrate, a diamond substrate, and a quartz ($SiO_2$) substrate, each as a single-crystal substrate, and the results of those experiments were essentially the same.

Figure 11:
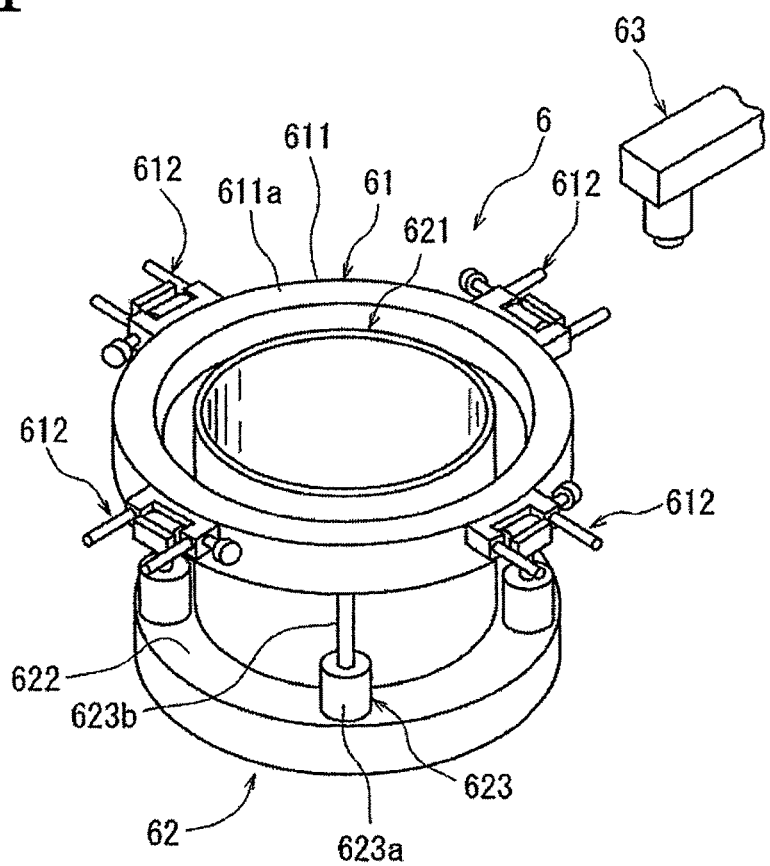
FIG. 11 is a perspective view of a dividing apparatus for dividing an optical device wafer wherein shield tunnels have been formed into individual optical devices.

After the above shield tunnel step has been carried out, a wafer dividing step is performed to apply an external force to the optical device wafer 2 to divide the optical device wafer 2 along the division lines 211 where the shield tunnels 23 including the fine holes 231 and the amorphous regions 232 formed in the region surrounding the fine holes 231 have been successively formed, into individual optical devices 212. The wafer dividing step is carried out using a dividing apparatus 6 illustrated in FIG. 11. As illustrated in FIG. 11, the dividing apparatus 6 includes frame holding means 61 for holding the annular frame F, tape expanding means 62 for expanding the optical device wafer 2 supported to the annular frame F held by the frame holding means 61, and a pickup collet 63. The frame holding means 61 includes an annular frame holding member 611 and a plurality of clamps 612 as fixing means provided on the outer circumference of the frame holding member 611. The upper surface of the frame holding member 611 functions as a mounting surface 611a for mounting the annular frame F thereon. The annular frame F mounted on the mounting surface 611a is fixed to the frame holding member 611 by the clamps 612. The frame holding means 61 is supported by the tape expanding means 62 so as to be vertically movable.

Figure 12A:
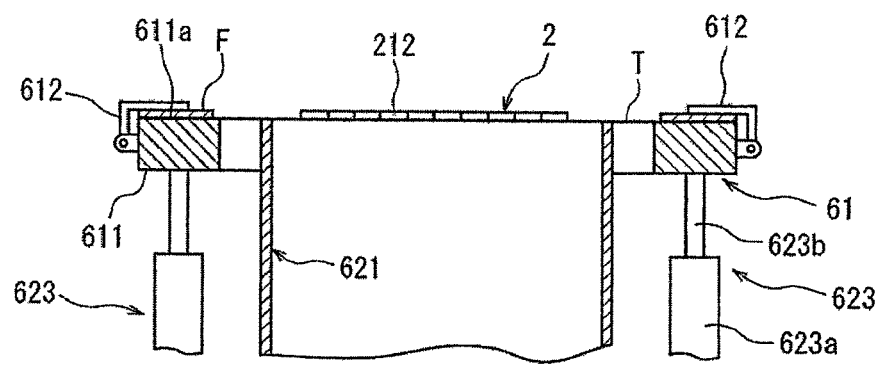
FIGS. 12A through 12C are views illustrating a wafer dividing step that is carried out by the dividing apparatus illustrated in FIG. 11.
Figure 12B:
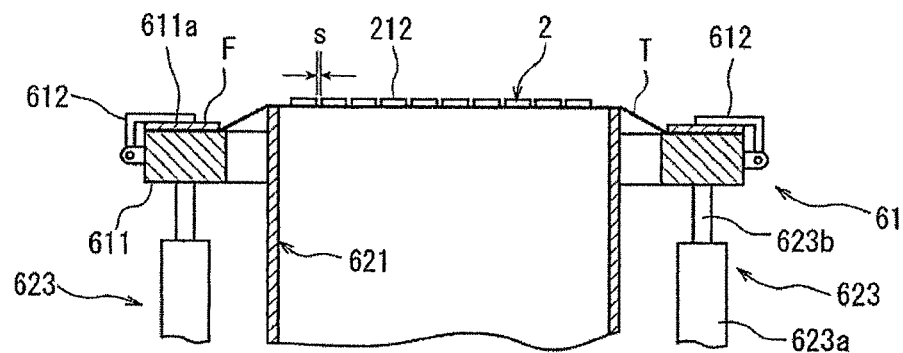

The tape expanding means 62 includes an expanding drum 621 provided inside of the annular frame holding member 611. The expanding drum 621 has an outer diameter smaller than the inner diameter of the annular frame F and an inner diameter larger than the outer diameter of the semiconductor wafer 2 attached to the dicing tape T supported to the annular frame F. The expanding drum 621 has a supporting flange 622 at the lower end of the drum 621. The tape expanding means 62 further includes supporting means 623 for vertically movably supporting the annular frame holding member 611. The supporting means 623 includes a plurality of air cylinders 623a provided on the supporting flange 622. Each air cylinder 623a is provided with a piston rod 623b connected to the lower surface of the annular frame holding member 611. The supporting means 623 including these plural air cylinders 623a functions to vertically move the annular frame holding member 611 so as to selectively take a reference position where the mounting surface 611a is substantially equal in height to the upper end of the expanding drum 621 as illustrated in FIG. 12A and an expansion position where the mounting surface 611a is lower in height than the upper end of the expanding drum 621 by a predetermined amount as illustrated in FIG. 12B.

The wafer dividing step using the dividing apparatus 6 will now be described with reference to FIGS. 12A to 12C. As illustrated in FIG. 12A, the annular frame F supporting the semiconductor wafer 2 through the dicing tape T is mounted on the mounting surface 611a of the frame holding member 611 of the frame holding means 61 and fixed to the frame holding member 611 by the clamps 612 (frame holding step). At this time, the frame holding member 611 is set at the reference position illustrated in FIG. 12A. Thereafter, the air cylinders 623a as the supporting means 623 of the tape expanding means 62 are operated to lower the frame holding member 611 to the expansion position illustrated in FIG. 12B. Accordingly, the annular frame F fixed to the mounting surface 611a of the frame holding member 611 is also lowered, so that the dicing tape T supported to the annular frame F comes into abutment against the upper end of the expanding drum 621 and is expanded as illustrated in FIG. 12B (tape expanding step). As a result, a tensile force acts on the semiconductor wafer 2 attached to the dicing tape T in the radial direction of the semiconductor wafer 2. Accordingly, the individual optical devices 212 are divided along the division lines 211 whose mechanical strength has been reduced by the shield tunnels 23 continuously formed therein, and an increased spacing S is formed between any adjacent ones of the individual optical devices 212.

Figure 12C:
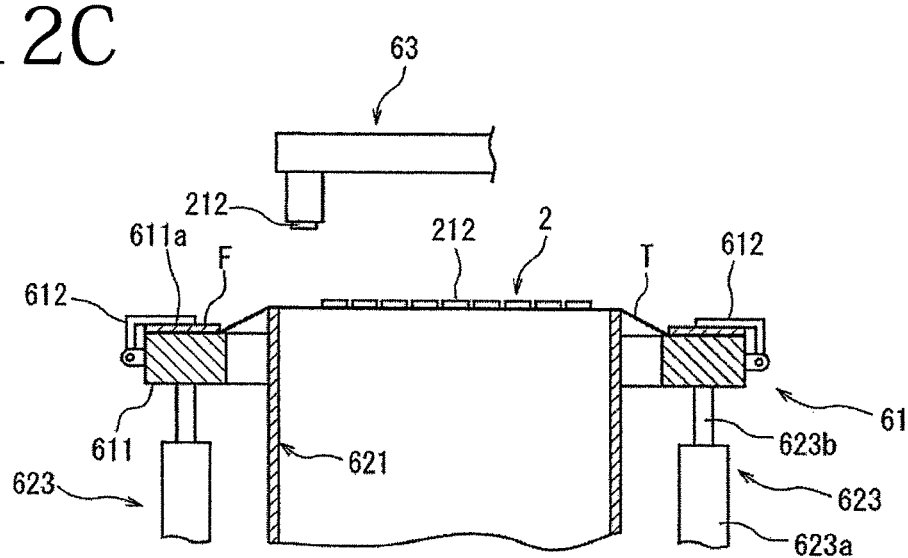

Thereafter, the pickup collet 63 is operated to hold each optical device 212 under suction and peel it from the dicing tape T, thus individually picking up the optical devices 212 as illustrated in FIG. 12C (pickup step). Thereafter, each optical device 212 as a device chip thus picked up is transferred to a non-illustrated tray or a position where a die bonding step is performed. It is to be noted that the increased spacing S is formed between any adjacent ones of the individual optical devices 212 attached to the dicing tape T, so that each optical device 212 can be easily picked up without the contact with its adjacent optical device 212 in the pickup step.

Although the present invention has been described on the basis of the illustrated embodiments, the present invention is not limited to the embodiments only, but various changes and modifications may be made therein within the scope of the invention. In the film removing step according to the above embodiments, the optical device layer 21 as the film is cut away along the division lines 211 by the cutting blade 323 with the annular cutter 325 on its outer circumference. However, if a metal film is formed as the film on the back side of a semiconductor wafer, then a masking whose regions corresponding to the division lines 211 are cut out may be placed on the metal film, and those regions of the metal film which correspond to the division lines 211 may be etched away.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A processing method of a single-crystal substrate having a film formed on a front side or a back side thereof to divide the single-crystal substrate along a plurality of preset division lines, comprising:
   a film removing step of removing the film formed on the single-crystal substrate along the division lines;
   a shield tunnel forming step of applying a pulsed laser beam having a wavelength which transmits through the single-crystal substrate along the division lines to form shield tunnels, each shield tunnel including a fine hole and an amorphous region shielding the fine hole, in the single-crystal substrate along the division lines after performing the film removing step, wherein the fine holes extend from regions where the film has been removed during the film removing step toward an opposite side of the single-crystal substrate, wherein the shield tunnels are formed at predetermined intervals, and wherein a value generated by dividing the numerical aperture of a condensing lens of a converging unit by the refractive index of the single-crystal substrate is in the range of from 0.05 to 0.4; and
   a dividing step of exerting an external force on the single-crystal substrate to which the shield tunnel forming step is performed to divide the single-crystal substrate along the division lines in which the shield tunnels are formed;
   wherein the pulsed laser beam is applied from a side of the single-crystal substrate where the film is formed, through the regions where the film is removed, in the shield tunnel forming step.

2. The processing method of the single-crystal substrate according to claim 1, wherein the film removing step is performed by a cutting blade with an annular cutter on an outer circumference thereof.

3. The processing method of the single-crystal substrate according to claim 1, wherein the film removing step is performed by etching.

4. The processing method of the single-crystal substrate according to claim 1, further comprising:
   a permeable film coating step of coating the regions where the film is removed with a permeable film that is permeable to the wavelength of the pulsed laser beam after performing the film removing step and before performing the shield tunnel forming step.

5. The processing method of the single-crystal substrate according to claim 1, wherein the pulsed layer beam used in the shield tunnel forming step has a peak energy density set to a value in a range from 1 TW/cm$^2$ to 100 TW/cm$^2$.

6. The processing method of the single-crystal substrate according to claim 1, wherein the predetermined intervals are 10 μm.

7. The processing method of the single-crystal substrate according to claim 1, wherein the fine holes extend from the front side of the single-crystal substrate to the back side of the single-crystal substrate.

8. The processing method of the single-crystal substrate according to claim 1, wherein the pulsed laser beam used in the shield tunnel forming step is set to a pulse width of between 0.7 ps and 63 ps and a repetitive frequency of between 7 kHz and 640 kHz.

9. A processing method of a single-crystal substrate having a film formed on a front side or a back side thereof to divide the single-crystal substrate along a plurality of preset division lines, comprising:
   a film removing step of removing the film formed on the single-crystal substrate along the division lines;
   a shield tunnel forming step of applying a pulsed laser beam having a wavelength which transmits through the single-crystal substrate along the division lines to form shield tunnels, each shield tunnel including a fine hole and an amorphous region shielding the fine hole, in the single-crystal substrate along the division lines after performing the film removing step, wherein the shield tunnels are formed at predetermined intervals, and wherein a value generated by dividing the numerical aperture of a condensing lens of a converging unit by the refractive index of the single-crystal substrate is in the range of from 0.05 to 0.4; and
   a dividing step of exerting an external force on the single-crystal substrate to which the shield tunnel forming step is performed to divide the single-crystal substrate along the division lines in which the shield tunnels are formed;
   wherein the pulsed laser beam is applied from a side of the single-crystal substrate where the film is formed, through regions where the film is removed, in the shield tunnel forming step,
   wherein the method further comprises a film coating step of coating the regions where the film is removed with a film that is transmissive to the wavelength of the pulsed laser beam after performing the film removing step and before performing the shield tunnel forming step.

10. The processing method of the single-crystal substrate according to claim 9, wherein the film removing step is performed by a cutting blade with an annular cutter on an outer circumference thereof.

11. The processing method of the single-crystal substrate according to claim 9, wherein the film removing step is performed by etching.

12. The processing method of the single-crystal substrate according to claim 9, wherein the pulsed layer beam used in the shield tunnel forming step has a peak energy density set to a value in a range from 1 TW/cm$^2$ to 100 TW/cm$^2$.

13. The processing method of the single-crystal substrate according to claim 9, wherein the predetermined intervals are 10 µm.

14. The processing method of the single-crystal substrate according to claim 9, wherein the fine holes extend from the front side of the single-crystal substrate to the back side of the single-crystal substrate.

15. The processing method of the single-crystal substrate according to claim 9, wherein the pulsed laser beam used in the shield tunnel forming step is set to a pulse width of between 0.7 ps and 63 ps and a repetitive frequency of between 7 kHz and 640 kHz.

16. A processing method of a single-crystal substrate having a film formed on a front side or a back side thereof to divide the single-crystal substrate along a plurality of preset division lines, comprising:
- a film removing step of removing the film formed on the single-crystal substrate along the division lines;
- a shield tunnel forming step of applying a pulsed laser beam having a wavelength which permeates through the single-crystal substrate along the division lines to form shield tunnels, each shield tunnel including a fine hole and an amorphous region shielding the fine hole, in the single-crystal substrate along the division lines after performing the film removing step, wherein the fine holes extend from regions where the film has been removed during the film removing step toward an opposite side of the single-crystal substrate; and
- a dividing step of exerting an external force on the single-crystal substrate to which the shield tunnel forming step is performed to divide the single-crystal substrate along the division lines in which the shield tunnels are formed;
- wherein the pulsed laser beam is applied from a side of the single-crystal substrate where the film is formed, through the regions where the film is removed, in the shield tunnel forming step,
- wherein the fine holes each have a diameter of approximately 1 µm; and
- wherein the amorphous regions surrounding the fine holes each have a diameter of approximately 10 µm.

17. The processing method of the single-crystal substrate according to claim 16, wherein the pulsed laser beam used in the shield tunnel forming step is set to a pulse width of between 0.7 ps and 63 ps and a repetitive frequency of between 7 kHz and 640 kHz.

18. A processing method of a single-crystal substrate having a film formed on a front side or a back side thereof to divide the single-crystal substrate along a plurality of preset division lines, comprising:
- a film removing step of removing the film formed on the single-crystal substrate along the division lines;
- a shield tunnel forming step of applying a pulsed laser beam having a wavelength which permeates through the single-crystal substrate along the division lines to form shield tunnels, each shield tunnel including a fine hole and an amorphous region shielding the fine hole, in the single-crystal substrate along the division lines after performing the film removing step; and
- a dividing step of exerting an external force on the single-crystal substrate to which the shield tunnel forming step is performed to divide the single-crystal substrate along the division lines in which the shield tunnels are formed;
- wherein the pulsed laser beam is applied from a side of the single-crystal substrate where the film is formed, through regions where the film is removed, in the shield tunnel forming step,
- wherein the method further comprises a permeable film coating step of coating the regions where the film is removed with a permeable film that is permeable to the wavelength of the pulsed laser beam after performing the film removing step and before performing the shield tunnel forming step,
- wherein the fine holes each have a diameter of approximately 1 µm; and
- wherein the amorphous regions surrounding the fine holes each have a diameter of approximately 10 µm.

19. The processing method of the single-crystal substrate according to claim 18, wherein the pulsed laser beam used in the shield tunnel forming step is set to a pulse width of between 0.7 ps and 63 ps and a repetitive frequency of between 7 kHz and 640 kHz.

* * * * *